United States Patent
You et al.

(10) Patent No.: US 12,225,752 B2
(45) Date of Patent: Feb. 11, 2025

(54) ENCAPSULATING COVER PLATE, FABRICATION METHOD THEREOF, DISPLAY PANEL AND FABRICATION METHOD THEREOF

(71) Applicant: BOE TECHNOLOGY GROUP CO., LTD., Beijing (CN)

(72) Inventors: Juanjuan You, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 601 days.

(21) Appl. No.: 17/293,636

(22) PCT Filed: May 27, 2020

(86) PCT No.: PCT/CN2020/092563
§ 371 (c)(1),
(2) Date: May 13, 2021

(87) PCT Pub. No.: WO2020/238947
PCT Pub. Date: Dec. 3, 2020

(65) Prior Publication Data
US 2022/0013745 A1   Jan. 13, 2022

(30) Foreign Application Priority Data
May 31, 2019 (CN) .......................... 201910472237.2

(51) Int. Cl.
*H10K 50/824*      (2023.01)
*H10K 59/12*       (2023.01)
(Continued)

(52) U.S. Cl.
CPC ......... *H10K 50/824* (2023.02); *H10K 59/122* (2023.02); *H10K 71/135* (2023.02);
(Continued)

(58) Field of Classification Search
CPC ... H10K 50/82–846; H10K 59/10–221; H10K 71/00–191; H10K 71/60;
(Continued)

(56) References Cited
U.S. PATENT DOCUMENTS 7,812,523 B2 * 10/2010 Jung ................... H10K 50/805
                                                    313/506
7,999,457 B2 *  8/2011 Yoon ................... H10K 50/816
                                                    313/506
(Continued)

FOREIGN PATENT DOCUMENTS

CN    101882666 A    11/2010
CN    103024960 A     4/2013
(Continued)

OTHER PUBLICATIONS

China Patent Office, CN201910472237.2 First Office Action issued on Nov. 30, 2020.
(Continued)

*Primary Examiner* — Caleb E Henry
(74) *Attorney, Agent, or Firm* — HOUTTEMAN LAW LLC

(57) ABSTRACT

An encapsulating cover plate, a method for fabricating the same, a display panel and a method for fabricating the same are provided. The encapsulating cover plate includes a first base substrate; a first auxiliary electrode on the first base substrate; and a second auxiliary electrode on a side of the first auxiliary electrode away from the first base substrate, an orthographic projection of the second auxiliary electrode on the first base substrate being within an orthographic projection of the first auxiliary electrode on the first base substrate. A material of the first auxiliary electrode includes an organic conductive polymer, and a material of the second auxiliary electrode includes a conductive metal.

18 Claims, 3 Drawing Sheets

(51) Int. Cl.
*H10K 59/122* (2023.01)
*H10K 71/13* (2023.01)
*H10K 71/60* (2023.01)
*H10K 102/00* (2023.01)

(52) U.S. Cl.
CPC ......... *H10K 71/60* (2023.02); *H10K 59/1201* (2023.02); *H10K 2102/3026* (2023.02)

(58) Field of Classification Search
CPC ......... H10K 71/611; H10K 2102/3026; H10K 59/122; H10K 59/80522; H10K 59/871
See application file for complete search history.

(56) References Cited

U.S. PATENT DOCUMENTS

| | | | |
|---|---|---|---|
| 9,101,005 B2 | 8/2015 | Chen | |
| 2001/0043046 A1* | 11/2001 | Fukunaga | H10K 50/81 315/169.3 |
| 2004/0185604 A1* | 9/2004 | Park | H01L 27/12 438/149 |
| 2005/0127829 A1* | 6/2005 | Takahashi | H10K 50/844 313/504 |
| 2006/0017059 A1 | 1/2006 | Strip et al. | |
| 2013/0134449 A1* | 5/2013 | Chen | H10K 59/1795 438/34 |
| 2014/0183502 A1* | 7/2014 | Song | H10K 50/824 257/40 |
| 2015/0372072 A1* | 12/2015 | Xiong | H10K 59/1315 438/46 |
| 2016/0240810 A1* | 8/2016 | Oh | H10K 85/221 |

FOREIGN PATENT DOCUMENTS

| | | |
|---|---|---|
| CN | 103985739 A | 8/2014 |
| CN | 106803547 A | 6/2017 |
| CN | 109037481 A | 12/2018 |
| CN | 110137379 A | 8/2019 |

OTHER PUBLICATIONS

China Patent Office, CN201910472237.2 Second Office Action issued on Apr. 15, 2021.

China Patent Office, CN201910472237.2 Decision of Rejection issued on Aug. 13, 2021.

* cited by examiner

ENCAPSULATING COVER PLATE, FABRICATION METHOD THEREOF, DISPLAY PANEL AND FABRICATION METHOD THEREOF

CROSS REFERENCE TO RELATED APPLICATIONS

This is a National Phase Application filed under 35 U.S.C. 371 as a national stage of PCT/CN2020/092563, filed on May 27, 2020, an application claiming priority to Chinese patent application No. 201910472237.2, filed on May 31, 2019, the contents of which are incorporated herein by reference.

TECHNICAL FIELD

The present disclosure belongs to the field of display technology, and particularly relates to an encapsulating cover plate, a method for fabricating an encapsulating cover plate, a display panel and a method for fabricating a display panel.

BACKGROUND

Organic Light Emitting Diode (OLED) displays have been recognized as the third generation display technology following liquid crystal displays due to their advantages, such as lightness, thinness, active light emission, fast response speed, wide viewing angle, rich colors, high brightness, low power consumption, and high-temperature resistance and low-temperature resistance. OLED displays are increasingly applied to products such as smart phones, large-size TVs and tablet computers, and have a very broad market prospect.

SUMMARY

In an aspect, the present disclosure provides an encapsulating cover plate for an organic light emitting diode (OLED) display panel, including: a first base substrate; a first auxiliary electrode on the first base substrate; and a second auxiliary electrode on a side of the first auxiliary electrode away from the first base substrate, an orthographic projection of the second auxiliary electrode on the first base substrate being within an orthographic projection of the first auxiliary electrode on the first base substrate. A material of the first auxiliary electrode includes an organic conductive polymer, and a material of the second auxiliary electrode includes a conductive metal.

In some embodiments, the organic conductive polymer includes at least one of polyacetylene, polythiophene, polypyrrole, polyaniline, polyphenylene, polyphenylene vinylene, or polydiacetylene.

In some embodiments, the material of the second auxiliary electrode includes a conductive alloy.

In some embodiments, the material of the second auxiliary electrode includes at least one of silver, aluminum, copper, gold, or molybdenum.

In another aspect, the present disclosure provides an OLED display panel, including the encapsulating cover plate described herein.

In some embodiments, the OLED display panel further includes an OLED array substrate including a second base substrate and an OLED device on the second base substrate. The OLED device includes a first electrode, a transparent second electrode, and a light emitting layer between the first electrode and the second electrode. The second electrode is on a light emitting surface of the OLED array substrate. The encapsulating cover plate and the OLED array substrate are arranged oppositely, and the second auxiliary electrode is electrically coupled to the second electrode of the OLED device.

In some embodiments, the OLED device includes a top-emission type OLED device.

In some embodiments, an orthographic projection of the first auxiliary electrode on the second base substrate does not overlap an orthographic projection of the light emitting layer on the second base substrate.

In some embodiments, the OLED array substrate includes a plurality of OLED devices, and the plurality of OLED devices share a same second electrode.

In still another aspect, the present disclosure provides a method for fabricating an encapsulating cover plate, including: forming a first auxiliary electrode on a first base substrate; a material of the first auxiliary electrode including an organic conductive polymer; and forming a second auxiliary electrode on a side of the first auxiliary electrode away from the first base substrate through an electroplating process, a material of the second auxiliary electrode including a conductive metal, and an orthographic projection of the second auxiliary electrode on the first base substrate being within an orthographic projection of the first auxiliary electrode on the first base substrate.

In some embodiments, the first auxiliary electrode is formed on the first base substrate through an ink-jet printing process or a transfer printing process.

In some embodiments, the material of the second auxiliary electrode includes a conductive alloy.

In some embodiments, the organic conductive polymer includes at least one of polyacetylene, polythiophene, polypyrrole, polyaniline, polyphenylene, polyphenylene vinylene, or polydiacetylene.

In some embodiments, the material of the second auxiliary electrode includes at least one of silver, aluminum, copper, gold, or molybdenum.

In still another aspect, the present disclosure provides a method for fabricating an organic light emitting diode (OLED) display panel, including: fabricating an OLED array substrate including a second base substrate and an OLED device on the second base substrate, the OLED device including a first electrode, a transparent second electrode, and a light emitting layer between the first electrode and the second electrode, the second electrode being on a surface of the OLED array substrate; fabricating an encapsulating cover plate by using the method described herein; and aligning the OLED array substrate and the encapsulating cover plate to form a cell, such that the second auxiliary electrode of the encapsulating cover plate is electrically coupled to the second electrode of the OLED device.

In some embodiments, after the OLED array substrate and the encapsulating cover plate are aligned to form the cell, an orthographic projection of the first auxiliary electrode on the second base substrate does not overlap an orthographic projection of the light emitting layer on the second base substrate.

DETAILED DESCRIPTION

Figure 1:
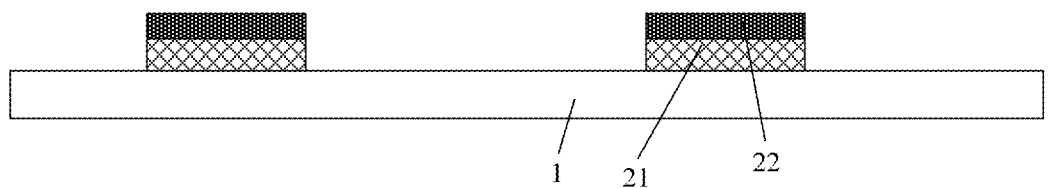
FIG. 1 is a schematic diagram illustrating a structure of an encapsulating cover plate according to an embodiment of the present disclosure.

To make those skilled in the art better understand the technical solutions of the present disclosure, the following detailed description is given with reference to the accompanying drawings and the specific embodiments.

In a top-emission type OLED display panel, an OLED device includes a first electrode, a transparent second electrode, and a light emitting layer sandwiched between the first electrode and the transparent second electrode. The first electrode is typically an anode, and the second electrode is a transparent cathode and is typically located on the surface of the OLED array substrate. The transparent cathode is typically made of a material such as a transparent metal or a conductive metal oxide. Because the light transmittance of the OLED device needs to be considered, the transparent cathode is thin, and thus the conductivity of the cathode is poor. When the size of the display panel is large, the central area of the display panel is far away from the electrode interface, and the driving voltage in the central area is greatly increased due to long-distance current transmission, so that the difference between the driving voltage of the OLED device in the edge area of the display panel and the driving voltage of the OLED device in the central area of the display panel is large, and the voltage drop (IR drop) problem occurs. If only the driving circuit is modified, it is difficult to effectively improve the IR drop, and the display panel still has the defect that the brightness in the central area is low.

In order to increase the conductivity of the cathode and reduce the difference between the driving voltages, an auxiliary electrode or an auxiliary wire may be formed on the transparent cathode. Typically, a low-resistivity auxiliary electrode is used in direct contact with the cathode to effect connection to the cathode to reduce the effect of the resistance of the electrode on the circuit. However, the direct fabrication of the auxiliary electrode on the transparent cathode has the following constraints: firstly, the metal material of the transparent cathode is very easy to be oxidized and needs to be isolated from moisture, oxygen and other substances with strong oxidizability; and secondly, the organic light emitting material layer in the OLED device may deteriorate at high temperature, which may directly affect the performance of the OLED device, so the fabrication process of the auxiliary electrode cannot have a high temperature process. In view of the above, the auxiliary electrode may be fabricated by using nano-silver through ink-jet printing, transfer printing, screen printing, or other processes. However, in these wet processes of silver nano-wires, it is difficult to control the polarity of the solvent for nano-silver. Under the condition of higher polarity, the line width of the formed auxiliary electrode is larger, and under the condition of lower polarity, the aggregation of nano-silver is easily caused, so that the problem of wire breakage is caused. Therefore, it is difficult to form an auxiliary electrode having a narrow line width and low resistance.

Accordingly, the present disclosure provides, inter alia, an encapsulating cover plate for an organic light emitting diode display panel, an organic light emitting diode display panel including the same, and a method for fabricating the same, which substantially obviate one or more of the problems due to limitations and disadvantages of the related art. In one aspect, the present disclosure provides an encapsulating cover plate for an organic light emitting diode display panel, including: a first base substrate; a first auxiliary electrode on the first base substrate; and a second auxiliary electrode on a side of the first auxiliary electrode away from the first base substrate. An orthographic projection of the second auxiliary electrode on the first base substrate is within an orthographic projection of the first auxiliary electrode on the first base substrate. A material of the first auxiliary electrode includes an organic conductive polymer, and a material of the second auxiliary electrode includes a conductive metal.

As used herein, a sub-pixel region refers to a light emission region of a sub-pixel, such as a region corresponding to a light emitting layer in an organic light emitting diode display panel. A pixel may include several separate light emission regions corresponding to several sub-pixels in the pixel. The sub-pixel region may be a light emission region of a red sub-pixel. The sub-pixel region may be a light emission region of a green sub-pixel. The sub-pixel region may be a light emission region of a blue sub-pixel. The sub-pixel region may be a light emission region of a white sub-pixel. As used herein, an inter-sub-pixel region refers to a region between adjacent sub-pixel regions, such as a region corresponding to a pixel definition layer in an organic light emitting diode display panel. The inter-sub-pixel region may be a region between adjacent sub-pixel regions in a same pixel. The inter-sub-pixel region may be a region between two adjacent sub-pixel regions from two adjacent pixels. The inter-sub-pixel region may be a region between a sub-pixel region of a red sub-pixel and a sub-pixel region of an adjacent green sub-pixel. The inter-sub-pixel region may be a region between a sub-pixel region of a red sub-pixel and a sub-pixel region of an adjacent blue sub-pixel. The inter-sub-pixel region may be a region between a sub-pixel region of a green sub-pixel and a sub-pixel region of an adjacent blue sub-pixel.

Figure 2:
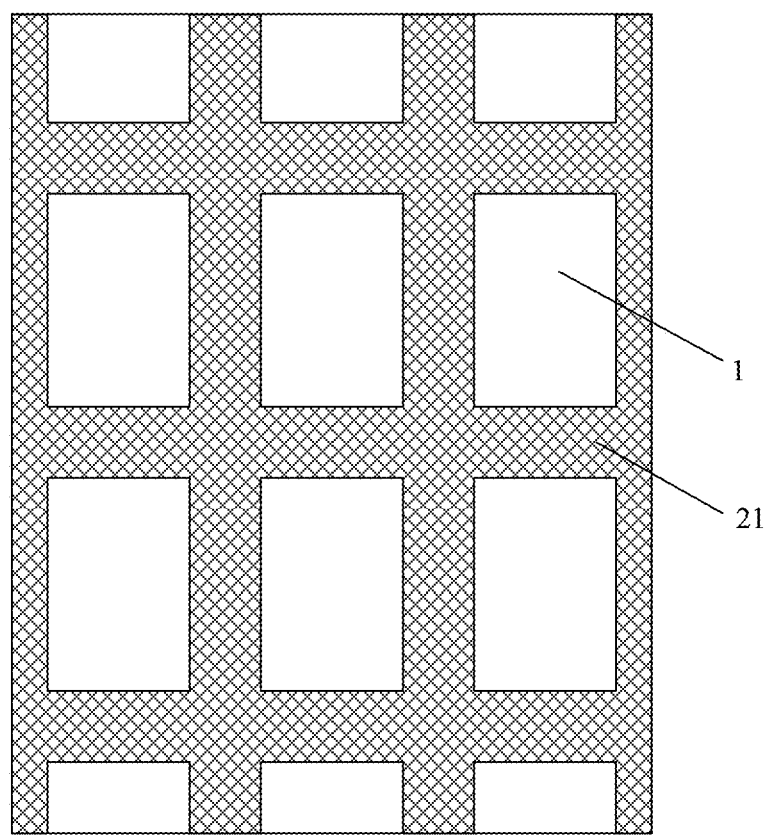
FIG. 2 is a schematic plan view illustrating a structure of an encapsulating cover plate according to an embodiment of the present disclosure.

As shown in FIGS. 1 and 2, embodiments of the present disclosure provide an encapsulating cover plate, which may be used in an OLED display panel to implement encapsulation of an OELD device and is particularly suitable for encapsulation of a top-emission type OLED display panel.

As shown in FIG. 1, an encapsulating cover plate according to an embodiment of the present disclosure includes: a first base substrate 1, and a first auxiliary electrode 21 and a second auxiliary electrode 22, which are stacked on the first base substrate 1. The first auxiliary electrode 21 is closer to the first base substrate 1 than the second auxiliary electrode 22. An orthographic projection of the second auxiliary electrode 22 on the first base substrate 1 is within an orthographic projection of the first auxiliary electrode 21 on the first base substrate 1. A material of the first auxiliary electrode 21 includes an organic conductive polymer, and a material of the second auxiliary electrode includes a conductive metal.

In the embodiment of the present disclosure, the auxiliary electrodes (the first auxiliary electrode 21 and the second auxiliary electrode 22) are disposed on the encapsulating cover plate, and after the encapsulating cover plate and the OLED array substrate are completely aligned to form a cell, the auxiliary electrodes are just electrically coupled to the second electrode (for example, the transparent cathode) of the OLED device on the surface of the OLED array substrate, so that the conductivity of the cathode of the OLED device is enhanced, the IR drop of the large-size OLED display panel is effectively reduced, and the display effect of the OLED display panel is significantly improved.

It should be noted that the material of the first auxiliary electrode 21 in the auxiliary electrodes according to the embodiment of the present disclosure includes the organic conductive polymer. The fabrication process of the electrode based on the material of the organic conductive polymer is mature, and the line width thereof is easy to be controlled, so that the first auxiliary electrode 21 having a narrow line width can be easily obtained. Further, based on the first auxiliary electrode 21 having a narrow line width, the second auxiliary electrode 22 having a narrow line width may be formed on the first auxiliary electrode 21 by an electroplating process. Therefore, in the encapsulating cover plate according to the embodiment of the present disclosure, the line width of the auxiliary electrode is narrower, which is beneficial to improving the aperture ratio of the OLED display panel.

In some embodiments, the organic conductive polymer includes at least one of polyacetylene, polythiophene, polypyrrole, polyaniline, polyphenylene, polyphenylene vinylene, or polydiacetylene.

In some embodiments, the material of the second auxiliary electrode 22 may include a conductive metal, a conductive alloy, or the like. In some embodiments, the second auxiliary electrode 22 is made of a conductive metal having a relatively low resistivity, such as silver, aluminum, copper, gold, molybdenum.

An embodiment of the present disclosure further provides an OLED display panel, which may include the above-mentioned encapsulating cover plate.

Figure 3A:
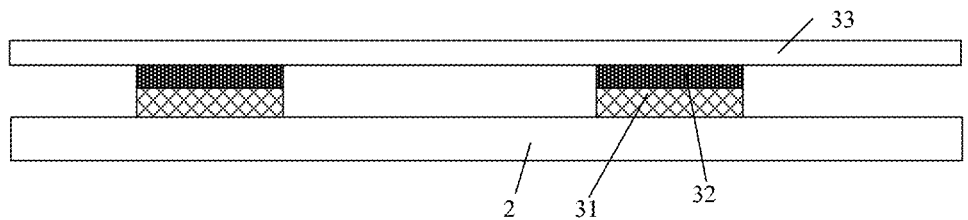
FIG. 3A is a schematic diagram illustrating a structure of an OLED array substrate according to an embodiment of the present disclosure.
Figure 3B:
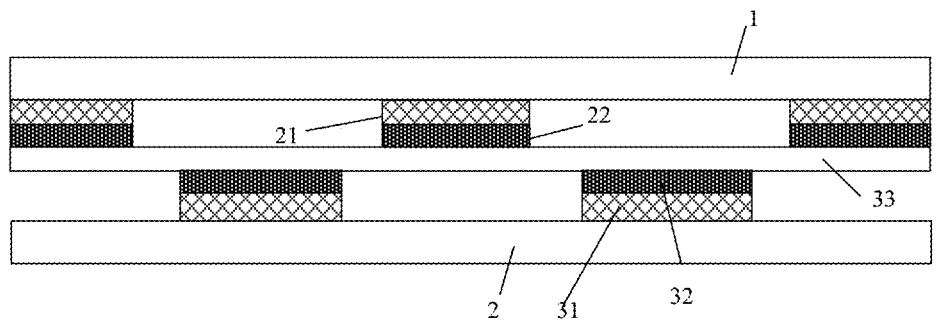
FIG. 3B is a schematic diagram illustrating a structure of an OLED display panel according to an embodiment of the present disclosure.

In addition, as shown in FIG. 3B, the OLED display panel further includes an OLED array substrate. The OLED display panel is provided with a plurality of sub-pixel regions and inter-sub-pixel regions surrounding the sub-pixel regions. As shown in FIGS. 3A and 3B, the OLED array substrate includes a second base substrate 2 and an OLED device on the second base substrate 2. The OLED device is in the sub-pixel region. The OLED device includes a first electrode 31, a transparent second electrode 33, and a light emitting layer 32 sandwiched therebetween. The second electrode is on a light emitting side of the OLED array substrate.

The encapsulating cover plate and the OLED array substrate are arranged oppositely to form the OLED display panel. Meanwhile, the second auxiliary electrode 22 is electrically coupled to the second electrode 33 of the OLED device.

The OLED display panel according to the embodiment of the present disclosure is particularly suitable for a top-emission type OLED display panel, that is, the OLED device in the display panel is a top-emission type OLED device. When the OLED display panel is a top-emission type OLED display panel, as shown in FIG. 2, the second auxiliary electrode 22 is located at a position of the first base substrate 1 corresponding to an inter-sub-pixel region of the OLED display panel (in FIG. 2, each rectangular region corresponds to a respective sub-pixel region of the OLED display panel, and a region surrounding the rectangular region corresponds to the inter-sub-pixel region of the OLED display panel). In some embodiments, as shown in FIG. 3B, an orthographic projection of the first auxiliary electrode 21 on the second base substrate 2 does not overlap an orthographic projection of the light emitting layer 32 of the OLED device on the second base substrate 2. In some embodiments, an orthographic projection of the second auxiliary electrode 22 on the second base substrate 2 does not overlap the orthographic projection of the light emitting layer 32 of the OLED device on the second base substrate. It is so arranged because: the auxiliary electrodes (the first auxiliary electrode 21 and the second auxiliary electrode 22 in the embodiment of the present disclosure, and particularly the second auxiliary electrode 22 electrically coupled to the cathode of the OLED device) for the cathode of the OLED device are required to have a low resistivity, and thus, the material thereof is a non-transparent conductive metal material. Since the OLED device is of a top-emission type, the light emitting side thereof is the side of the cathode close to the encapsulating cover plate. In order to prevent the auxiliary electrode from blocking the light emission of the OLED device, the auxiliary electrode is disposed in the inter-sub-pixel region of the OLED display panel, that is, the first auxiliary electrode 21 and the second auxiliary electrode 22 are located at positions of the first base substrate 1 corresponding to the inter-sub-pixel region of the OLED display panel.

In some embodiments, the OLED array substrate includes a plurality of OLED devices sharing a same second electrode. In this case, the second electrodes of the plurality of OLED devices are formed as a continuous layer.

The OLED display panel according to the embodiment may be applied in any product or component having a display function, such as an electronic paper, a mobile phone, a tablet computer, a television, a display, a notebook computer, a digital photo frame, and a navigator. Because the OLED display panel in the embodiment of the present disclosure includes the encapsulating cover plate according to the embodiment of the present disclosure, the line width of the auxiliary electrode is narrower, and the aperture ratio of the OLED display panel can be effectively improved.

Figure 4:
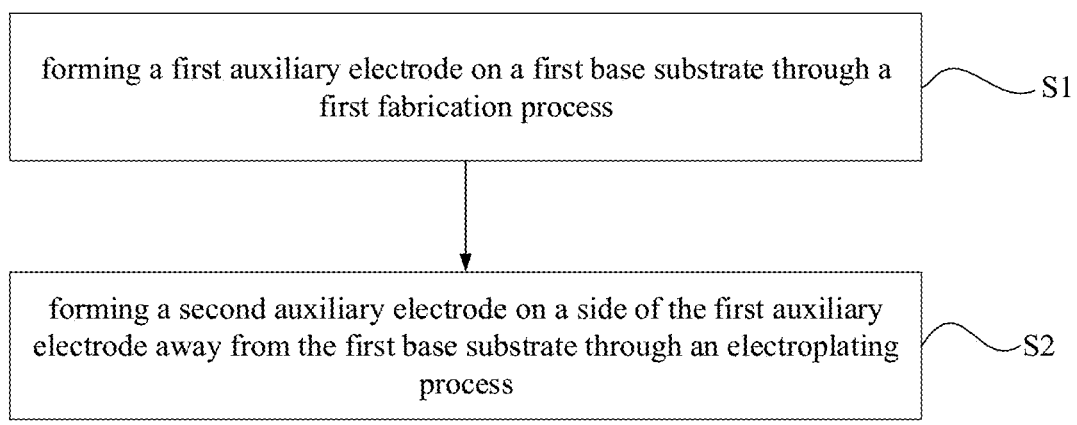
FIG. 4 is a flow chart showing a method for fabricating an encapsulating cover plate according to an embodiment of the present disclosure.

Embodiments of the present disclosure provide a method for fabricating an encapsulating cover plate, which can be used for fabricating the above-mentioned encapsulating cover plate. As shown in FIG. 4, the fabrication method may include the following steps S1 and S2.

At step S1, a first auxiliary electrode is formed on a first base substrate through a first fabrication process. A material of the first auxiliary electrode includes an organic conductive polymer.

The fabrication process of the electrode based on the organic conductive polymer material is mature, and the line width is easy to be controlled, so that the first auxiliary electrode having a narrow line width can be easily obtained. In some embodiments, the organic conductive polymer may include at least one of polyacetylene, polythiophene, polypyrrole, polyaniline, polyphenylene, polyphenylene vinylene, or polydiacetylene.

In this step, the first auxiliary electrode may be formed on the first base substrate through an ink-jet printing process or a transfer printing process, or the like.

At step S2, a second auxiliary electrode is formed on a side of the first auxiliary electrode away from the first base substrate through an electroplating process, and the second auxiliary electrode is formed such that an orthographic projection of the second auxiliary electrode on the first base substrate is within an orthographic projection of the first auxiliary electrode on the first base substrate. A material of the second auxiliary electrode includes a conductive metal or a conductive alloy. For example, the material of the second auxiliary electrode includes at least one of silver, aluminum, copper, gold, or molybdenum.

In this step, the second auxiliary electrode may be formed on the first auxiliary electrode by using the first auxiliary electrode formed in step S1 as a cathode in salt solution (plating solution) containing a pre-plating metal and depositing positive ions from the pre-plating metal contained in the plating solution on a surface of the first auxiliary electrode by electrolysis. Therefore, metal ions are very uniformly deposited on the surface of the first auxiliary electrode in an atomic mode under the action of current to form a metal film. The metal film is compact in structure, no pore is generated therein, even a pinhole does not appear therein after high-temperature baking, the conductivity thereof is better, and the adhesion force thereof is extremely strong.

Since the line width of the first auxiliary electrode formed in step S1 is narrow, and the second auxiliary electrode is formed on the first auxiliary electrode, the line width of the second auxiliary electrode is also narrow, and the second auxiliary electrode formed based on the electroplating process has a uniform film formation, and is not prone to wire breakage, and the yield of the encapsulating cover plate is high. It should be noted that the first auxiliary electrode made by using an organic conductive polymer through a printing or transfer printing process has a limited conductive property, and cannot be used as an auxiliary electrode of the cathode well. In the fabrication method provided by the embodiment, two layers of auxiliary electrodes are respectively fabricated, so that the auxiliary electrode (especially the second auxiliary electrode) having a narrow line width and a good conductive effect can be fabricated and the display effect of the OLED display panel can be effectively improved.

An embodiment of the present disclosure further provides a method for fabricating an OLED display panel. The method for fabricating the OLED display panel according to the present embodiment mainly includes fabrication of an OLED array substrate, fabrication of an encapsulating cover plate, and assembly of the OLED array substrate and the encapsulating cover plate.

Figure 5:
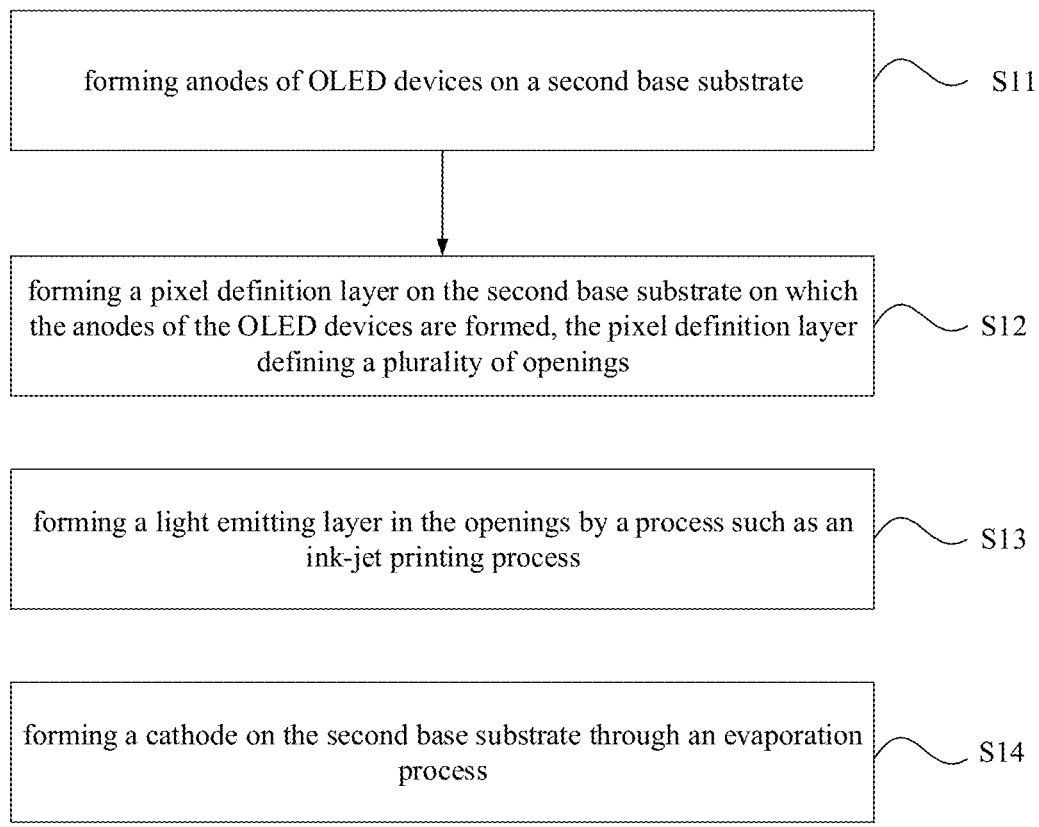
FIG. 5 is a flowchart showing a method for fabricating an OLED array substrate according to an embodiment of the present disclosure.

As shown in FIG. 5, the fabrication of the OLED array substrate may include steps S11 to S14.

At step S11, anodes of OLED devices are formed on a second base substrate.

At step S12, a pixel definition layer is formed on the second base substrate on which the anodes of the OLED devices are formed, the pixel definition layer defining a plurality of openings exposing the anodes of the OLED devices.

At step S13, a light emitting layer is formed in the openings by a process such as an ink-jet printing process.

At step S14, a cathode is formed on the second base substrate through an evaporation process. In some embodiments, cathodes of a plurality of OLED devices are formed as a unitary structure.

It can be understood that the fabrication of the OLED array substrate is well-known in the art, and the detailed fabrication process may refer to relevant information, which will not be described in detail herein.

The method for fabricating the encapsulating cover plate may refer to any method for fabricating the encapsulating cover plate provided in the embodiments of the present disclosure, and is not described in detail herein.

In the method for fabricating the OLED display panel, the order of fabrications of the OLED array substrate and the encapsulating cover plate is in no particular order, and the OLED array substrate and the encapsulating cover plate may be fabricated simultaneously or sequentially, which is not limited in the present embodiment.

After the OLED array substrate and the encapsulating cover plate are fabricated, the encapsulating cover plate and the OLED array substrate can be aligned to form a cell, and the second auxiliary electrode is coupled to the cathode of the OLED device, so that the resistance value of the cathode of the OLED device is reduced when the OLED device operates. In some embodiments, after the OLED array substrate and the encapsulating cover plate are aligned to form a cell, an orthographic projection of the first auxiliary electrode on the second base substrate does not overlap an orthographic projection of the light emitting layer on the second base substrate, and an orthographic projection of the second auxiliary electrode on the second base substrate does not overlap the orthographic projection of the light emitting layer on the second base substrate.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. An encapsulating cover plate for an organic light emitting diode (OLED) display panel, comprising:
   a first base substrate;
   a first auxiliary electrode on the first base substrate; and
   a second auxiliary electrode on a side of the first auxiliary electrode away from the first base substrate, an orthographic projection of the second auxiliary electrode on the first base substrate being within an orthographic projection of the first auxiliary electrode on the first base substrate,
   wherein a material of the first auxiliary electrode comprises an organic conductive polymer, and a material of the second auxiliary electrode comprises a conductive metal, and
   the orthographic of the first auxiliary electrode on the first base substrate does not overlap an orthographic projection of a first electrode of an OLED device on the first base substrate.

2. The encapsulating cover plate of claim 1, wherein the organic conductive polymer comprises at least one of polyacetylene, polythiophene, polypyrrole, polyaniline, polyphenylene, or polydiacetylene.

3. The encapsulating cover plate of claim 1, wherein the material of the second auxiliary electrode comprises a conductive alloy.

4. The encapsulating cover plate of claim 1, wherein the material of the second auxiliary electrode comprises at least one of silver, aluminum, copper, gold, or molybdenum.

5. An organic light emitting diode (OLED) display panel, comprising the encapsulating cover plate of claim 1 and an OLED array substrate.

6. The OLED display panel of claim 5, wherein
   the OLED array substrate comprises:
   a second base substrate; and
   the OLED device on the second base substrate; the OLED device comprising the first electrode, a transparent second electrode, and a light emitting layer between the first electrode and the transparent second electrode, wherein the transparent second electrode is on a light emitting surface of the OLED array substrate, wherein the encapsulating cover plate and the OLED array substrate are arranged oppositely, and the second auxiliary electrode is electrically coupled to the transparent second electrode of the OLED device.

7. The OLED display panel of claim 6, wherein the OLED device comprises a top-emission type OLED device.

8. The OLED display panel of claim 6, wherein an orthographic projection of the first auxiliary electrode on the second base substrate does not overlap an orthographic projection of the light emitting layer on the second base substrate.

9. The OLED display panel of claim 6, wherein the OLED array substrate comprises a plurality of OLED devices, and the plurality of OLED devices share a same transparent second electrode.

10. A method for fabricating an encapsulating cover plate, comprising:

forming a first auxiliary electrode on a first base substrate; a material of the first auxiliary electrode comprising an organic conductive polymer; and forming a second auxiliary electrode on a side of the first auxiliary electrode away from the first base substrate through an electroplating process, a material of the second auxiliary electrode comprising a conductive metal, and an orthographic projection of the second auxiliary electrode on the first base substrate being within an orthographic projection of the first auxiliary electrode on the first base substrate, wherein the orthographic of the first auxiliary electrode on the first base substrate does not overlap an orthographic projection of a first electrode of an OLED device on the first base substrate.

11. The method of claim 10, wherein the first auxiliary electrode is formed on the first base substrate through an ink-jet printing process or a transfer printing process.

12. The method of claim 10, wherein the material of the second auxiliary electrode comprises a conductive alloy.

13. The method of claim 10, wherein the organic conductive polymer comprises at least one of polyacetylene, polythiophene, polypyrrole, polyaniline, polyphenylene, or polydiacetylene.

14. The method of claim 10, wherein the material of the second auxiliary electrode comprises at least one of silver, aluminum, copper, gold, or molybdenum.

15. A method for fabricating an organic light emitting diode (OLED) display panel, comprising:

fabricating an OLED array substrate, the OLED array substrate comprising a second base substrate and an OLED device on the second base substrate; the OLED device comprising a first electrode, a transparent second electrode, and a light emitting layer between the first electrode and the transparent second electrode, wherein the second transparent electrode is on a light emitting surface of the OLED array substrate;

fabricating an encapsulating cover plate by using the method of claim 10; and aligning the OLED array substrate and the encapsulating cover plate to form a cell, such that the second auxiliary electrode of the encapsulating cover plate is electrically coupled to the transparent second electrode of the OLED device.

16. The method of claim 15, wherein after the OLED array substrate and the encapsulating cover plate are aligned to form the cell, an orthographic projection of the first auxiliary electrode on the second base substrate does not overlap an orthographic projection of the light emitting layer on the second base substrate.

17. The encapsulating cover plate of claim 1, wherein the organic conductive polymer comprises polyphenylene vinylene.

18. The method of claim 10, wherein the organic conductive polymer comprises polyphenylene vinylene.

* * * * *